US007902832B2

(12) United States Patent
Shimamura et al.

(10) Patent No.: US 7,902,832 B2
(45) Date of Patent: Mar. 8, 2011

(54) ANTENNA CABLE BREAK DETECTOR FOR CONSTRUCTION MACHINE WIRELESS COMMUNICATION APPARATUS AND CONSTRUCTION MACHINE WIRELESS COMMUNICATION APPARATUS

(75) Inventors: Tadatoshi Shimamura, Ishioka (JP); Hidenobu Tsukada, Tsuchiura (JP)

(73) Assignee: Hitachi Construction Machinery Co., Ltd., Tokyo (JP)

( * ) Notice: Subject to any disclaimer, the term of this patent is extended or adjusted under 35 U.S.C. 154(b) by 276 days.

(21) Appl. No.: 12/091,987

(22) PCT Filed: May 24, 2007

(86) PCT No.: PCT/JP2007/060588

§ 371 (c)(1),
(2), (4) Date: Apr. 29, 2008

(87) PCT Pub. No.: WO2007/138971

PCT Pub. Date: Dec. 6, 2007

(65) Prior Publication Data

US 2009/0267612 A1 Oct. 29, 2009

(30) Foreign Application Priority Data

May 26, 2006 (JP) ............................ 2006-146318

(51) Int. Cl.
*G01R 31/02* (2006.01)

(52) U.S. Cl. ..................................................... 324/539

(58) Field of Classification Search ................ 324/539, 324/543
See application file for complete search history.

(56) References Cited

U.S. PATENT DOCUMENTS

| | | | | |
|---|---|---|---|---|
| 5,216,434 | A * | 6/1993 | Fukumura | 343/876 |
| 6,215,315 | B1 * | 4/2001 | Maejima | 324/539 |
| 6,927,579 | B2 * | 8/2005 | Blades | 324/536 |
| 7,046,157 | B2 * | 5/2006 | Graube | 340/650 |
| 2002/0024342 | A1 * | 2/2002 | Bussinger | 324/541 |

FOREIGN PATENT DOCUMENTS

| | | |
|---|---|---|
| JP | 11-064432 | 3/1999 |
| JP | 01/73217 | 10/2001 |
| JP | 2002-056726 | 2/2002 |
| JP | 2004-192512 | 7/2004 |
| JP | 2005-344482 | 12/2005 |

* cited by examiner

*Primary Examiner*—Jeff Natalini
(74) *Attorney, Agent, or Firm*—Mattingly & Malur, P.C.

(57) ABSTRACT

An antenna cable break detector used with a construction machine wireless communication apparatus to detect a break in an antenna cable. The antenna cable 4 includes a central wire 6 and an armor wire 7 that is positioned concentrically outside the central wire. One end of the central wire and the armor wire is connected to a communication device. The other end of the central wire is connected to an antenna 3. The other end of the armor wire is grounded. The antenna cable break detector has a direct current shutoff device that is connected to the armor wire to shut off the flow of direct current 15 from the armor wire to the communication device. There is also a current shutoff detection device that is connected to the armor wire to detect the shutoff of the flow of a direct current to the armor wire.

4 Claims, 3 Drawing Sheets

ANTENNA CABLE BREAK DETECTOR FOR CONSTRUCTION MACHINE WIRELESS COMMUNICATION APPARATUS AND CONSTRUCTION MACHINE WIRELESS COMMUNICATION APPARATUS

TECHNICAL FIELD

The present invention relates to an antenna cable break detector for a construction machine wireless communication apparatus and to the construction machine wireless communication apparatus. More particularly, the invention relates to an antenna cable break detector for a construction machine wireless communication apparatus that is mounted in a hydraulic excavator or other construction machine to transmit/receive signals, and to the construction machine wireless communication apparatus.

BACKGROUND ART

In recent years, hydraulic excavators and other construction machines that incorporate a wireless communication apparatus to exchange signals with the outside and perform various processes are becoming widespread. The relevant technologies are disclosed, for instance, by Patent Documents 1 and 2. The technology described in Patent Document 1 is used to exchange work instruction data and work result data, which includes position data, between a wireless communication apparatus for each work machine and a management computer and provide management support for land surface treatment work, which includes a plurality of processes performed by using a plurality of work machines.

The technology described in Patent Document 2 is used to transmit component operation data from a hydraulic excavator operated at a work site to a base station computer and let the base station computer accumulate and calculate the component operation data and predict and manage the timing of parts repairs and replacements.

Meanwhile, the wireless communication apparatus generally includes a communication device, an antenna, and an antenna cable, and the communication device is connected to the antenna with the antenna cable. A conventional technology for detecting a break in the antenna cable is described in Patent Document 3. The technology described in Patent Document 3 uses an antenna cable that is integral with a detection cable having a shorter fatigue life than the antenna cable, and detects a break in the detection cable to predict the timing of antenna cable replacement.

A common technology for antenna cable break detection uses a signal wire that is laid along an antenna cable, and allows a detection current to flow in the signal wire. When it is detected that the detection current is shut off by a break in the signal wire, this technology concludes that the antenna cable is broken.

Patent Document 1: JP-A-2005-344482

Patent Document 2: WO 01/73217A1

Patent Document 3: JP-A-2002-56726

DISCLOSURE OF INVENTION

Problem to be Solved by the Invention

If the antenna cable breaks, the conventional technologies described in Patent Documents 1 and 2 cannot transmit/receive signals and fails to achieve the intended purpose. To properly cope with a break in the antenna cable, it is necessary to properly detect the break in the antenna cable.

The conventional technology described in Patent Document 3 is able to predict the timing of antenna cable replacement, but unable to detect a break in the antenna cable.

The common technology for antenna cable break detection can properly detect a break in the antenna cable when the antenna cable and signal wire are both broken (cut). However, it cannot properly detect a break in the antenna cable when either the antenna cable or the signal wire is broken.

An object of the present invention is to provide an antenna cable break detector that is used with a construction machine wireless communication apparatus to properly detect a break in an antenna cable. Another object of the present invention is to provide a construction machine wireless communication apparatus that is equipped with the above antenna cable break detector.

Means for Solving the Problem (1) In accomplishing the above objects, according to one aspect of the present invention, there is provided an antenna cable break detector for a construction machine wireless communication apparatus that includes a communication device mounted in a construction machine, an antenna, and an antenna cable, the antenna cable including a central wire and an armor wire that is positioned concentrically outside the central wire, one end each of the central wire and the armor wire being connected to the communication device, the other end of the central wire being connected to the antenna, the other end of the armor wire being grounded, the antenna cable break detector comprising: direct current shutoff means that is connected to the armor wire of the antenna cable to shut off a direct current flow from the armor wire to the communication device; and current shutoff detection means that is connected to the armor wire of the antenna cable to detect the shutoff of the direct current flow to the armor wire.

The present invention configured as described above is based on a finding that it is extremely unlikely that only the central wire or only the armor wire may break in a situation where the armor wire is positioned concentrically outside the central wire. When the direct current shutoff means and current shutoff detection means are incorporated to detect the shutoff of a direct current flow in the armor wire of the antenna cable, a break in the armor wire of the antenna cable can be detected. When a break in the armor wire of the antenna cable is detected, a break in the antenna can be properly detected.

(2) According to another aspect of the present invention, there is provided the antenna cable break detector as described in (1) above, further comprising: alternating current shutoff means for shutting off an alternating current flow from the armor wire of the antenna cable to the current shutoff detection means.

Consequently, a current shutoff detection circuit can properly detect the shutoff of a direct current because it is not affected by an alternating current. This makes it possible to detect a break in the antenna cable with increased accuracy.

(3) According to another aspect of the present invention, there is provided the antenna cable break detector as described in (1) or (2) above, further comprising: processing means that performs a communication breakdown process when the current shutoff detection means detects the shutoff of the direct current flow in the armor wire.

Consequently, the present invention makes it possible to perform an appropriate process after antenna cable breakage.

(4) In accomplishing the above objects, according to still another aspect of the present invention, there is provided a construction machine wireless communication apparatus that includes a communication device mounted in a construction machine, an antenna, and an antenna cable, the antenna cable including a central wire and an armor wire that is positioned concentrically outside the central wire, one end each of the armor wire and the armor wire being connected to the communication device, the other end of the central wire being connected to the antenna, the other end of the armor wire being grounded, the construction machine wireless communication apparatus further comprising: an antenna cable break detector for detecting a break in the antenna cable, wherein the antenna cable break detector includes direct current shutoff means that is connected to the armor wire of the antenna cable to shut off a direct current flow from the armor wire to the communication device, and current shutoff detection means that is connected to the armor wire of the antenna cable to detect the shutoff of the direct current flow to the armor wire.

Consequently, the present invention makes it possible to properly detect a break in the antenna cable as described in (1) above.

Advantages of the Invention

The antenna cable break detector according to the present invention includes the direct current shutoff means and current shutoff detection means and detects the shutoff of a direct current flow to the armor wire of the antenna cable to detect a break in the armor wire. Further, the armor wire of the antenna cable is positioned concentrically outside the central wire, and it is extremely unlikely that only the central wire or only the armor wire may break. Therefore, a break in the antenna cable can be properly detected by detecting a break in the armor wire of the antenna cable as described above.

Further, the antenna cable break detector according to the present invention includes the processing means for performing a communication breakdown process. Therefore, when the current shutoff detection means detects the shutoff of a direct current flow in the armor wire, the antenna cable break detector can properly perform a process after antenna cable breakage.

Furthermore, the antenna cable break detector according to the present invention permits the use of a common coaxial cable as the antenna cable that includes the central wire and the armor wire, which is positioned concentrically outside the central wire. Therefore, the present invention eliminates the necessity of developing and manufacturing a dedicated antenna cable for use with the antenna cable break detector and makes it possible to achieve cost reduction.

BEST MODE FOR CARRYING OUT THE INVENTION

Embodiments of the present invention will now be described with reference to the accompanying drawings.

First of all, an example of a construction machine that incorporates a wireless communication apparatus according to an embodiment of the present invention, uses the wireless communication apparatus to exchange signals with the outside, and performs various processes will be described with reference to FIG. 1.

Figure 1:
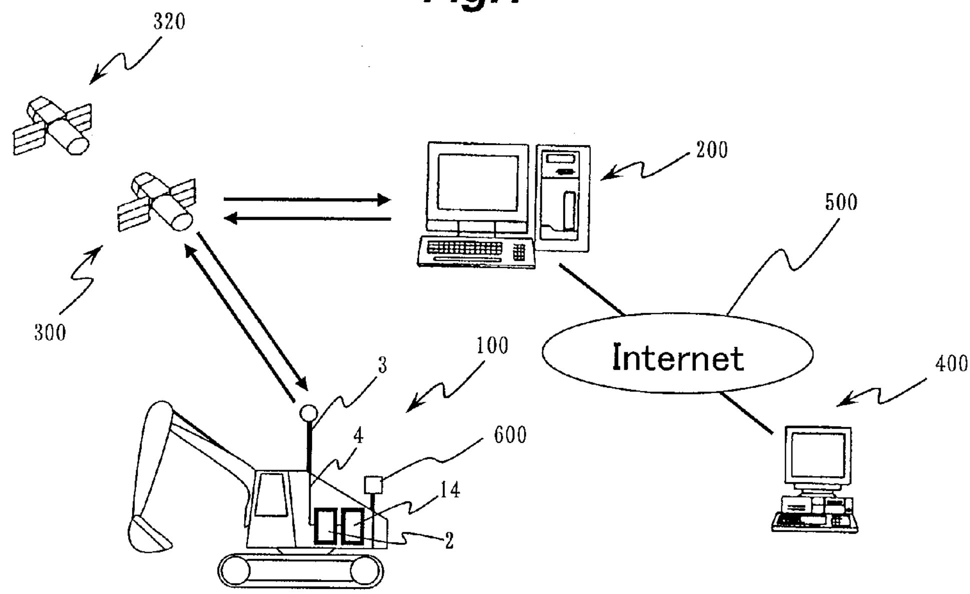
FIG. 1 is a conceptual diagram illustrating an example of a construction machine that incorporates a wireless communication apparatus, uses the wireless communication apparatus to exchange signals with the outside, and performs various processes.

Referring to FIG. 1, the construction machine 100 incorporates a communication device 2, allows a controller 14 to collect vehicle information, position information, work result information, and other machine side information, and transmits the collected information to a center server 200, which is installed at a base station, through the communication device 2, an antenna cable 4, and an antenna 3. The center server 200 receives the information via a communications satellite 300 and puts it into a database. At an administration station, an administrator can use a PC terminal 400 to access the center server 200 through the Internet 500, and confirm the machine side information about the construction machine 100 in real time.

Further, the administrator uses the PC terminal 400 to access the center server 200 through the Internet 500, and transmits work instruction information, topographical information, and other administrator side information to the construction machine 100 via the communications satellite 300. The administrator side information is received by the communication device 2 through the antenna 3 and antenna cable 4 and forwarded to the controller 14.

An antenna cable break detector according to the present embodiment is used with the communication device mounted in the construction machine described above.

The antenna cable break detector according to an embodiment of the present invention will now be described with reference to FIGS. 2 to 4.

Figure 2:
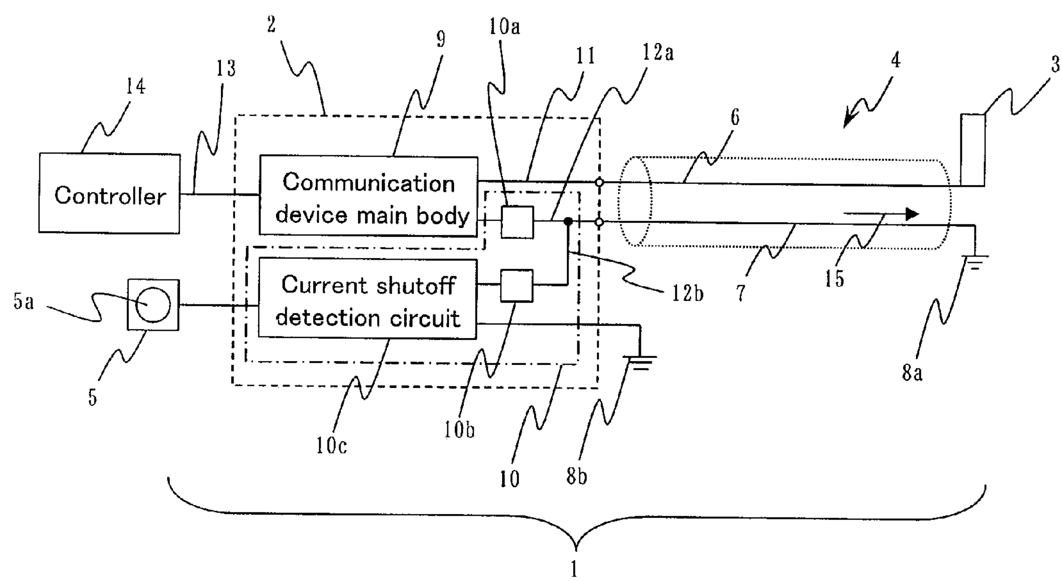
FIG. 2 shows the overall configuration of a wireless communication apparatus that includes an antenna cable break detector according to an embodiment of the present invention.

FIG. 2 shows the overall configuration of a wireless communication apparatus that includes the antenna cable break detector according to the present embodiment. The wireless communication apparatus is designated by the reference numeral 1. The wireless communication apparatus 1 includes a display device 5 in addition to the aforementioned communication device 2, antenna 3, and antenna cable 4.

The antenna cable 4 includes a central wire 6 and an armor wire 7, which is positioned concentrically outside the central wire 6. One end each of the central wire 6 and armor wire 7 is connected to the communication device 2. The other end of the central wire 6 is connected to the antenna 3. The other end of the armor wire 7 is connected to a ground 8*a*.

The communication device 2 includes a communication device main body 9 and the antenna cable break detector 10.

The communication device main body 9 is connected to the central wire 6 of the antenna cable 4 through a communication wire 11, connected to the armor wire 7 of the antenna cable 4 through a communication wire 12*a*, and connected to the controller 14 through a communication wire 13 to transmit/receive the machine side information and administrator side information. When machine side information and administrator side information signals flow in the central wire 6 and antenna 3, an alternating current representing changes in the signals flows in the armor wire 7.

The antenna cable break detector 10 causes a direct current 15 to flow in the armor wire 7 and detects the shutoff of the direct current 15 to detect a break in the armor wire 7, thereby detecting a break in the antenna cable 4. The antenna cable break detector 10 includes a direct current shutoff circuit 10$a$, a current shutoff detection circuit 10$c$, and an alternating current shutoff circuit 10$b$. The direct current shutoff circuit 10$a$ is connected to the communication wire 12$a$ for connecting the armor wire 7 of the antenna cable 4 to the communication device main body 9, and used to shut off the direct current 15 that flows from the armor wire 7 toward the communication device main body 9. The current shutoff detection circuit 10$c$ is connected to a communication wire 12$b$ that branches off from a line between the direct current shutoff circuit 10$a$ on the communication wire 12$a$ and the armor wire 7, and used to detect the shutoff of the direct current 15 that flows in the armor wire 7. The alternating current shutoff circuit 10$b$ is connected to the communication wire 12$b$ and used to shut off an alternating current that flows from the armor wire 7 toward the current shutoff detection circuit 10$c$.

The display device 5 is connected to the current shutoff detection circuit 10$c$. When the current shutoff detection circuit 10$c$ detects the shutoff of the direct current 15 that flows to the armor wire 7, the display device 5 performs a communication breakdown process. In the currently used example, the communication breakdown process is performed to illuminate a lamp 5$a$ for the purpose of notifying an operator that communication cannot be established due to a break in the antenna cable 4.

Figure 3:
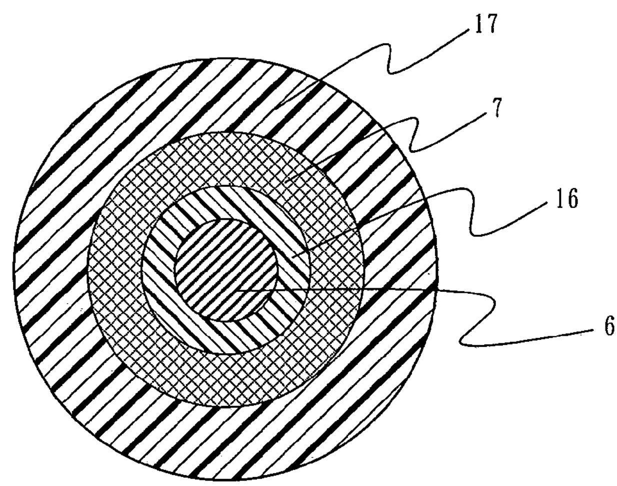
FIG. 3 is a transverse cross-sectional view illustrating in detail the structure of an antenna cable.

FIG. 3 is a transverse cross-sectional view illustrating in detail the structure of the antenna cable 4.

The antenna cable 4 includes the central wire 6 and armor wire 7 as described earlier. The armor wire 7 is positioned concentrically around the central wire 6 with a protective sheath 16 sandwiched between these two wires. In addition, a sheath 17 is positioned concentrically outside the armor wire 7. As described above, the central wire 6, protective sheath 16, armor wire 7, and sheath 17 are concentrically positioned within the antenna cable 4 in the order named.

Figure 4:
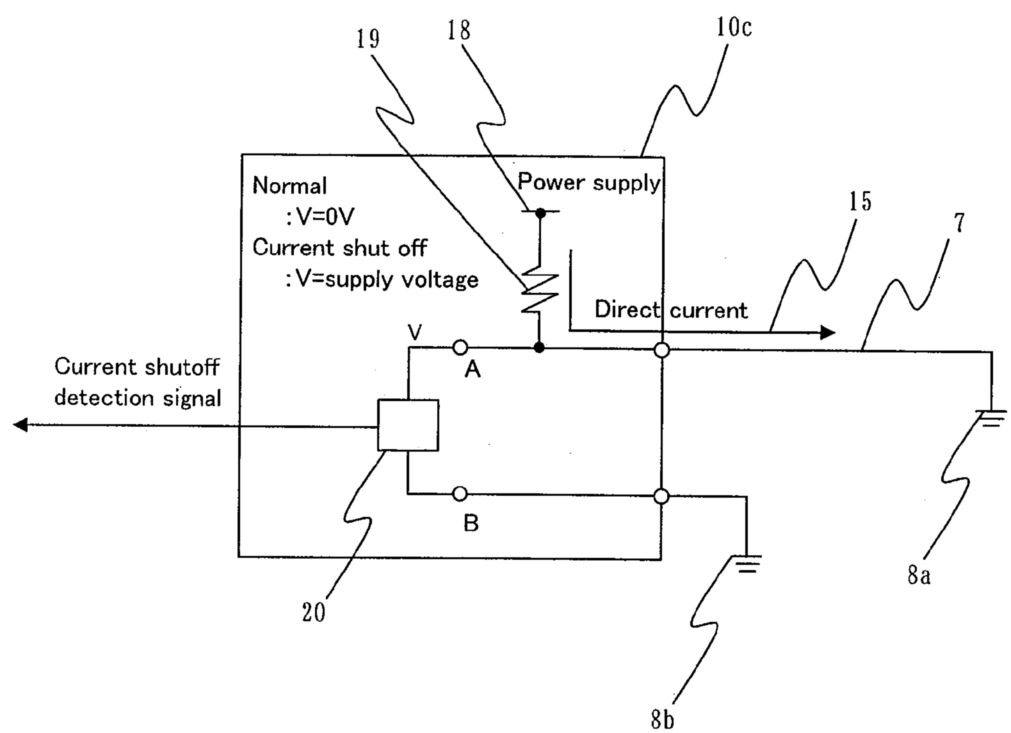
FIG. 4 shows a typical configuration of a current shutoff detection circuit.

FIG. 4 shows a typical configuration of the current shutoff detection circuit 10$c$.

The current shutoff detection circuit 10$c$ includes a power supply 18, a resistor 19, and a comparator 20.

One end of the resistor 19 is connected to the power supply 18. The other end of the resistor 19 is connected to the ground 8$a$ through the armor wire 7, and to input terminal A of the comparator 20, which has two input terminals that are designated A and B, respectively. The other input terminal B of the comparator 20 is connected to a ground 8$b$.

The comparator 20 compares an input voltage difference between input terminals A and B against a threshold voltage. If the input voltage difference is not greater than the threshold voltage, the comparator 20 turns OFF its signal output. If, on the other hand, the input voltage difference is greater than the threshold voltage, the comparator 20 turns ON its signal output.

More specifically, the comparator 20 operates as described below.

It is assumed that the voltage of input terminal A is VA, and that the voltage of input terminal B is VB, and further that the threshold voltage is V0 (which is equal to zero or close to zero). If $VA-VB \leqq V0$, the comparator 20 turns OFF its signal output. If $VA-VB>V0$, the comparator 20 turns ON its signal output.

The operation of the present embodiment, which is configured as described above, will now be described.

In a normal state where the armor wire 7 is not broken, the direct current 15 flows from the power supply 18 in the current shutoff detection circuit 10$c$ included in the antenna cable break detector 10 to the ground 8$a$ through the resistor 19 and armor wire 7. In this state, since the potential VA of input terminal A is equal to the ground potential, the input potentials VA, VB of the comparator 20 are the same ($\approx 0$ V) so that $VA-VB \approx 0\ V \leqq V0$. Therefore, the signal output of the comparator 20 is OFF.

In the above state, the direct current 15 does not flow toward the communication device main body 9 because the direct current shutoff circuit 10$a$ is provided between the communication device main body 9 and communication wire 12$a$.

Further, since the alternating current shutoff circuit 10$b$ is provided between the current shutoff detection circuit 10$c$ and communication wire 12$b$, the alternating current, which flows to the armor wire 7, does not flow toward the current shutoff detection circuit 10$c$ because it is shut off by the alternating current shutoff circuit 10$b$. Therefore, the current shutoff detection circuit 10$c$ remains unaffected by the alternating current. Consequently, the input voltage difference between input terminals A and B can be properly compared against the threshold voltage.

In an abnormal state where the armor wire 7 is broken, the direct current 15 does not flow to the armor wire 7. Therefore, the voltage is not decreased by the resistor 19 in the current shutoff detection circuit 10$c$. It means that the voltage V input to the comparator 20 is equal to or close to a supply voltage. Since voltage VB is constantly at ground potential ($\approx 0$ V), $VA-VB>V0$ in this case so that the signal output of the comparator 20 is ON.

The above signal is output to the display device 5 as a current shutoff detection signal so that the display device 5 illuminates the lamp 5$a$. This notifies the operator that communication cannot be established due to a break in the antenna cable 4.

Advantages of the present embodiment, which is configured as described above, will now be described in comparison with those provided by a conventional technology.

Figure 5:
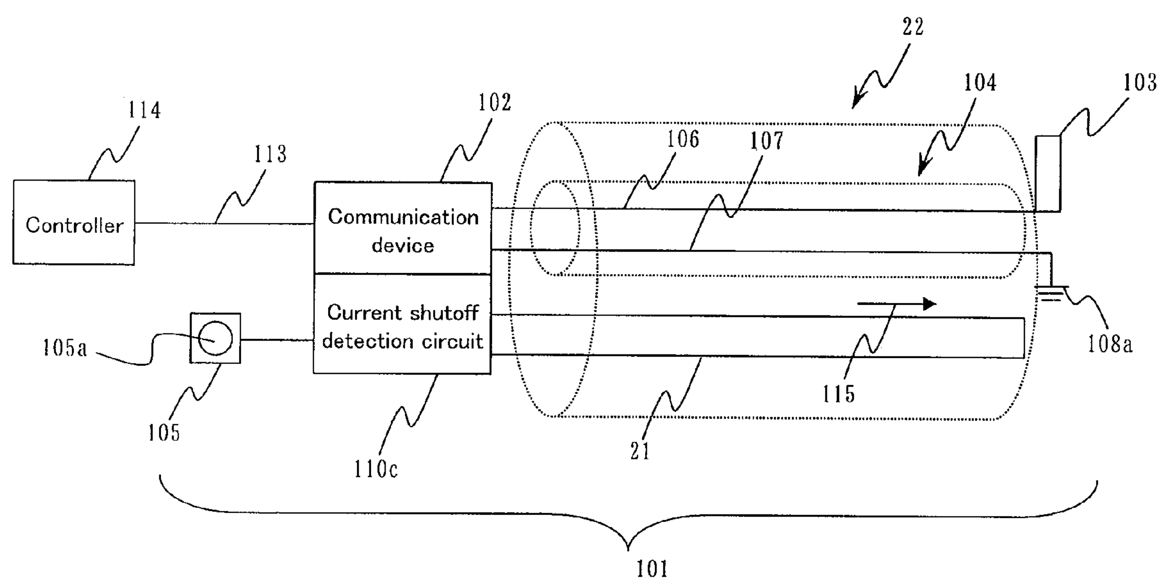
FIG. 5 shows an example of a conventional technology for an antenna cable break detector.

FIG. 5 shows an example of a conventional technology for an antenna cable break detector.

The conventional wireless communication device 101 shown in FIG. 5 uses a signal wire 21 in addition to an antenna cable 104. The signal wire 21 is laid along the antenna cable 104. The signal wire 21 and antenna cable 104 are both placed inside a protective pipe 22. The signal wire 21 is connected to a current shutoff detection circuit 110$c$. In a situation where a direct current 115 flows to the signal wire 21, the current shutoff detection circuit 110$c$ detects the shutoff of the direct current 115 to detect a break in the signal wire 21, thereby detecting a break in the antenna cable 104.

The conventional technology described above can properly detect a break in the antenna cable 104 when the antenna cable 104 and signal wire 21 are both broken.

However, if only the antenna cable 104 or only the signal wire 21 is broken, the above conventional technology cannot properly detect a break in the antenna cable 104.

More specifically, when only the antenna cable 104 is broken, a break in the antenna cable 104 is not detected. When only the signal wire 21 is broken, it is detected that the antenna cable 104 is broken although it is not actually broken. In either case, a break in the antenna cable 104 cannot be properly detected.

Meanwhile, the present embodiment allows the direct current 15 to flow to the armor wire 7 of the antenna cable 4 and permits the current shutoff detection circuit 10$c$ to detect the shutoff of the direct current 15. This results in the detection of a break in the armor wire 7, thereby detecting a break in the antenna cable 4.

As shown in FIG. 3, the antenna cable 4 is configured so that the armor wire 7 is positioned concentrically outside the central wire 6. Therefore, it is extremely unlikely that only the central wire 6 or only the armor wire 7 may break. Thus, erroneous detection does not result from a break in only the antenna cable 104 or a break in only the signal wire 21 unlike during the use of a conventional technology. Consequently, a break in the antenna cable 4 can be properly detected.

As described above, the present embodiment can properly detect a break in the antenna cable 4.

Further, since the alternating current shutoff circuit 10*b* is provided between the armor wire 7 and current shutoff detection circuit 10*c*, the present embodiment can shut off the alternating current flow from the armor wire 7 to the current shutoff detection circuit 10*c*. This enables the current shutoff detection circuit 10*c* to properly detect the shutoff of the direct current 15. As a result, a break in the antenna cable 4 can be detected with increased accuracy.

Furthermore, when a break in the antenna cable 4 is detected, the present embodiment performs the communication breakdown process in which the display device 5 illuminates the lamp 5*a*. This notifies the operator that communication cannot be established due to a break in the antenna cable.

Moreover, the present embodiment permits the use of a common coaxial cable as the antenna cable that includes the central wire 6 and the armor wire 7, which is positioned concentrically outside the central wire. Therefore, the present embodiment eliminates the necessity of developing and manufacturing a dedicated antenna cable for use with the antenna cable break detector, thereby making it possible to achieve cost reduction.

The present embodiment uses the alternating current shutoff circuit 10*b*. However, if the alternating current flowing from the armor wire 7 to the current shutoff detection circuit 10*c* is sufficiently small and negligible, the alternating current shutoff circuit 10*b* need not be used. Even when the employed configuration does not include the alternating current shutoff circuit 10*b*, it provides substantially the same advantages as the configuration according to the present embodiment.

The invention claimed is:

1. An antenna cable break detector for a construction machine wireless communication apparatus that includes a communication device mounted in a construction machine, an antenna, and an antenna cable, the antenna cable including a central wire and an armor wire that is positioned concentrically outside the central wire, one end each of the central wire and the armor wire being connected to the communication device, the other end of the central wire being connected to the antenna, the other end of the armor wire being grounded, the antenna cable break detector comprising:

a direct current shutoff device that is connected to the armor wire of the antenna cable to shut off a direct current flow from the armor wire to the communication device; and current shutoff detection device that is connected to the armor wire of the antenna cable, that applies a direct current to the armor wire from a power supply for detecting a break in the antenna cable, and detects the shutoff of the direct current.

2. The antenna cable break detector according to claim 1, further comprising:

an alternating current shutoff device for shutting off an alternating current flow from the armor wire of the antenna cable to the current shutoff detection device.

3. The antenna cable break detector according to claim 1, further comprising:

processing means that performs a communication breakdown process when the current shutoff detection device detects the shutoff of the direct current flow in the armor wire.

4. A construction machine wireless communication apparatus that includes a communication device mounted in a construction machine, an antenna, and an antenna cable, the antenna cable including a central wire and an armor wire that is positioned concentrically outside the central wire, one end each of the central wire and the armor wire being connected to the communication device, the other end of the central wire being connected to the antenna, the other end of the armor wire being grounded, the construction machine wireless communication apparatus further comprising:

an antenna cable break detector for detecting a break in the antenna cable;

wherein the antenna cable break detector includes a direct current shutoff device that is connected to the armor wire of the antenna cable to shut off a direct current flow from the armor wire to the communication device, and a current shutoff detection device that is connected to the armor wire of the antenna cable, that applies a direct current to the armor wire from a power supply for detecting a break in the antenna cable, and detects the shutoff of the direct current.

* * * * *